US008617455B2

(12) United States Patent
Mazumder

(10) Patent No.: US 8,617,455 B2
(45) Date of Patent: Dec. 31, 2013

(54) ALIGNED POROUS SUBSTRATES BY DIRECTIONAL MELTING AND RESOLIDIFICATION

(75) Inventor: Prantik Mazumder, Ithaca, NY (US)

(73) Assignee: Corning Incorporated, Corning, NY (US)

( * ) Notice: Subject to any disclaimer, the term of this patent is extended or adjusted under 35 U.S.C. 154(b) by 679 days.

(21) Appl. No.: 12/473,669

(22) Filed: May 28, 2009

(65) Prior Publication Data
US 2010/0301527 A1   Dec. 2, 2010

(51) Int. Cl.
*B28B 1/54* (2006.01)
(52) U.S. Cl.
USPC ............................................. 264/630
(58) Field of Classification Search
USPC ............................................. 264/630
See application file for complete search history.

(56) References Cited

U.S. PATENT DOCUMENTS

| | | | | |
|---|---|---|---|---|
| 4,323,614 | A | | 4/1982 | Gulati ........................... 428/116 |
| 4,417,908 | A | | 11/1983 | Pitcher, Jr. ...................... 55/523 |
| 4,753,783 | A | * | 6/1988 | Sanjurjo ......................... 423/350 |
| 5,114,643 | A | | 5/1992 | Beall et al. ...................... 264/63 |
| 5,628,938 | A | * | 5/1997 | Sangeeta et al. ................. 264/28 |
| 5,901,556 | A | | 5/1999 | Hofler ............................. 62/6 |
| 6,059,015 | A | * | 5/2000 | Bewlay et al. ................. 164/493 |
| 6,725,670 | B2 | | 4/2004 | Smith et al. ..................... 62/6 |
| 2002/0125240 | A1 | | 9/2002 | Ogura et al. ................ 219/444.1 |
| 2010/0215899 | A1 | * | 8/2010 | Mazumder et al. ........... 428/117 |

OTHER PUBLICATIONS

Pfann, William G. Zone Melting. New York, John Wiley & Sons, 1958. pp. 22-26, 28-31, 51, 71-77, 81-83, 122-125, 151-157, 206-208, 229-241, 280-281.*
Deville, "Freeze-Casting of Porous Ceramics: A review of Current Achievements and Issues," Advanced Engineering Materials 2008, 10, No. 3.
Deville, et al, "Freeze casting of hydroxyapatite scaffolds for bone tissue engineering," J. Bio Materials, Jun. 28, 2006.
Deville, et al, "Freezing as a Path to Build Complex Composites," Science 311,515 (2006).
Liu, et al, "A new thermal assembly design for the directional solidification of transparent alloys," J. of Crystal Growth 240 (2002) 560-568.
Mazumder, et al, "A Model of Convection-Induced Oscillatory Structure Formation in Peritectic Alloys," Metallurgical and Materials Transactions A, vol. 31A, Apr. 2000—1233.
Mazumder, et al, "Convection Induced Pattern Formation in Directional Solidification," Fluid Flow Phenomena in Metals Processing, The Minerals, Metals & Materials Society, 1999.
Mazumder, et al, "Integrated simulation of thermo-solutal convection and pattern formation in directional solidification," Applied mathematical Modelling 28 (2004) 109-125.
Trivedi, et al, "Directional solidification microstructures in diffusive and convective regimes," J. of Crystal Growth 222, (2001), 365-379.

(Continued)

*Primary Examiner* — Joe Del Sole
*Assistant Examiner* — Erin Snelting
(74) *Attorney, Agent, or Firm* — Michael W. Russell

(57) ABSTRACT

A method of forming a templated casting involves incorporating a liquid feedstock into the channels of a honeycomb substrate to form a feedstock-laden substrate, solidifying the liquid feedstock within the channels, and then locally melting and directionally re-solidifying the feedstock.

16 Claims, 2 Drawing Sheets

(56) References Cited

OTHER PUBLICATIONS

Trivedi, et al, "Dynamic Pattern Formation in the Two Phase Region of Peritectic Systems," Ames Laboratory US-DOE, Iowa State University, Ames, IA 50011, 2nd workshop on Solidification Microstructures, Zermatt, Jul. 5-10, 1998.

Trevedi, et al, "Microstructure development in the directionally solidified Al-4.0 wt% Cu alloy system," Science and Technology of Advanced Materials 2 (2001) 309-320.

Trevedi, et al, "The Effect of Convection on Disorder in Primary Cellular and Dendritic Arrays," Metallurgical and Materials Transactions A, vol. 33A, Dec. 2002—3763.

* cited by examiner

ALIGNED POROUS SUBSTRATES BY DIRECTIONAL MELTING AND RESOLIDIFICATION

BACKGROUND AND SUMMARY

The present invention relates generally to the templated growth of porous or non-porous castings, and more specifically to the formation of porous or non-porous castings via localized melting and directional re-solidification within a honeycomb substrate.

Porous substrates can be used in a wide variety of applications including catalysis, filtration, membranes, etc. And while numerous processing techniques such as extrusion and foaming have been developed to produce porous and other cellular materials, it remains difficult during processing to precisely and efficiently control the size, shape, directionality, isotropy (or anisotropy), connectivity and tortuosity of the porosity and/or the cellular structure. An additional challenge in forming cellular materials relates to the ubiquitous use of pore forming agents and the difficulties associated with removing them from the final product.

Non-porous substrates comprising crystalline metals (e.g., Cu) and semiconductors (e.g., Si, GaAs, etc.) can be used in both semiconductor and non-semiconductor applications. For example, ingots of polycrystalline silicon can be prepared for photovoltaic applications via directional solidification in quartz crucibles as an alternative to Czochralski (CZ) growth. In addition to semiconductor materials, directional solidification can also be used to form metallic and ceramic substrates. As used herein, a substrate is a material upon which a process is conducted, or upon which a device or structure is constructed.

Localized melting and directional re-solidification relate generally to a series of measures applied to control a solid-to-liquid and subsequent liquid-to-solid phase transformation and the attendant formation of a solidified or cast body. The cast body or cast structure described herein is a solid shape. Localized melting involves passing a solidified feedstock through a temperature gradient in order to melt a portion of the feedstock. Directional solidification involves passing the liquid or molten portion of the feedstock through a temperature gradient in order to cause re-solidification.

The solid feedstock can be derived from an initially liquid feedstock, which can comprise a single-component liquid such as molten silicon or a multi-component liquid such as molten alloys (e.g., silicon-germanium alloys). In turn, multi-component liquid feedstocks can comprise either a single phase (e.g., molten Si—Ge alloys or water-PVA solutions) or multiple phases. An example of a multi-phase liquid feedstock is a dispersion of gas bubbles, immiscible liquid and/or solid particles in one or more liquids. A dispersion can be an emulsion or a colloid.

Localized melting and directional re-solidification can be used to form porous or non-porous materials, including metals, semiconductors, ceramics, polymers or composites thereof. Microstructured, cellular materials, for example, can be cast from a multi-component feedstock that comprises a dispersion (i.e., slurry) of particles in a liquid. The process involves solidifying a liquid feedstock within a matrix, locally melting and directionally re-solidifying the feedstock within the matrix, removing the solidified (previously liquid) phase, and optionally densifying the resulting structure. In the case of unidirectional solidification, a porous body can be formed having unidirectional channels (i.e., linear porosity) where the channels are formed from the volume previously occupied by the solidified phase. On the other hand, non-porous castings can be derived from single component or multi-component liquid feedstocks such as, for example, molten silicon or molten metal alloys. Localized, directional re-solidification can be used as a near net shape forming route. The matrix, which is used as a template, can be a honeycomb substrate.

In both single- and multi-component feedstock systems, in order to control the microstructure and hence the resulting properties of the re-solidified material, it is important during re-solidification to maintain a spatially-uniform solidification front (liquid-solid interface). In addition, in multi-component systems it is important to maintain a laterally uniform distribution of particles and/or solute along the liquid-solid interface. These conditions are difficult to achieve in practice due to the presence of density gradient-driven convection in the liquid phase.

Convection in directional solidification results from inevitable thermal gradients within the system. Even in the example of vertically stable density stratification, the radial temperature gradients that are present in the liquid can produce convention currents. The convection currents can generate severe solute segregation as well as non-uniform (i.e., macroscopically-curved) solidification fronts. The solute segregation, in turn, can lead to concentration gradient-driven convection that may assist or oppose thermally driven convection. In the example of particulate-laden feedstocks, the convection currents can sweep the particles along the liquid-solid interface, which can lead to a highly non-uniform particle distribution. This problem will generally become more pronounced as the effective dimension of the liquid increases.

When producing porous castings via directional solidification, other issues that can be encountered, particularly with larger volume castings, are the loss of pore continuity or connectivity during solidification due to nucleation and growth of non-parallel grains and the inadequacy of green body strength in pre-densified samples.

In view of the foregoing, it would be advantageous to develop a method for preparing porous or non-porous castings via directional solidification that reduces thermal and/or solutal convection induced non-homogeneity along the liquid-solid interface, reduces the lack of green body strength in scaled-up samples, and reduces the loss of axial connectivity and the increase in tortuosity in porous castings due to the nucleation, growth and impingement of non-parallel grains.

According to one embodiment, a method of forming a templated casting comprises incorporating a liquid feedstock into the channels of a honeycomb substrate to form a feedstock-laden substrate, solidifying the liquid feedstock within the channels, locally melting the solidified feedstock and then directionally re-solidifying the melted material. The casting can comprise a porous or a non-porous structure.

A porous casting can be formed by solidifying a multi-component feedstock. According to one non-limiting example, the formation of a porous casting comprises incorporating a liquid dispersion into channels of a honeycomb substrate to form a dispersion-laden substrate, the dispersion comprising particles dispersed in a liquid, solidifying the liquid within the channels, moving the solid-laden substrate relative to a localized heat source in order to locally melt and directionally re-solidify the liquid within the channels, and removing the re-solidified material from within the channels to form a structure that comprises a porous body of the particles within the channels. Optionally, the particles, which can comprise one or more of metallic, semiconducting, ceramic and polymeric particles, can be sintered or impregnated to densify the cast structure. A non-porous casting can be formed by solidifying a single-component or a multi-component feedstock by omitting the act of removing the solidified phase.

In a further embodiment, a templated casting includes a honeycomb substrate having a plurality of channels, and a directionally-ordered cast structure incorporated within the channels. The honeycomb substrate itself can comprise a metallic, semiconducting, ceramic or polymeric material, or mixtures or composites thereof. By way of example, a honeycomb substrate can be formed from compounds such as plaster of Paris (e.g., $CaSO_4.0.5H_2O$) or elements such as sulfur. Optionally, the honeycomb substrate can be removed to yield a plurality of directionally-ordered castings of metallic, semiconducting, ceramic or polymeric material, or mixtures or composites thereof.

Additional features and advantages will be set forth in the detailed description which follows, and in part will be readily apparent to those skilled in the art from that description or recognized by practicing the various embodiments described herein, including the detailed description which follows, the claims, as well as the appended drawings.

It is to be understood that both the foregoing general description and the following detailed description present embodiments and examples, and are intended to provide an overview or framework for understanding the nature and character of the invention as it is claimed. The accompanying drawings are included to provide a further understanding, and are incorporated into and constitute a part of this specification. The drawings illustrate various embodiments of the invention and together with the description serve to explain the principles and operations of the invention.

DETAILED DESCRIPTION

Figure 1:
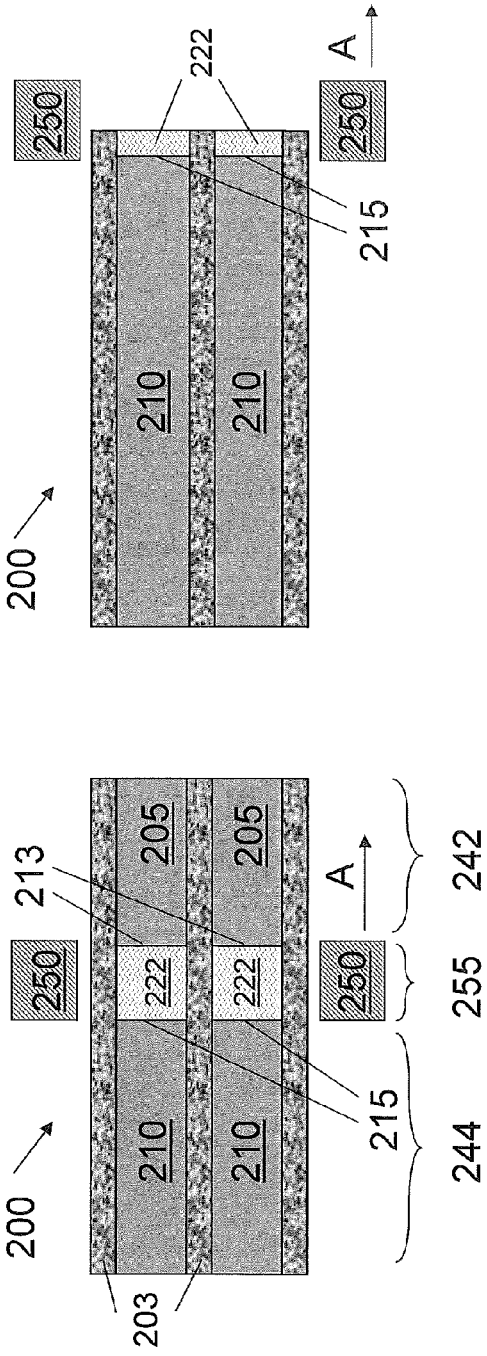
FIG. 1 is a schematic illustration of a localized heater coil directional solidification apparatus.

A method of forming a templated casting comprises incorporating a liquid feedstock into the channels of a honeycomb substrate to form a feedstock-laden substrate, solidifying the liquid feedstock within the channels, locally melting the solidified feedstock to form liquid pools, and directionally re-solidifying the melt.

Prior to solidifying the liquid feedstock, the liquid feedstock can comprise a single-component liquid (e.g., single phase or multi-phase) or a multi-component liquid (e.g., single phase or multi-phase). Table 1 sets forth example feedstocks suitable for forming a templated casting.

TABLE 1

Example Single- and Multi-Component Feedstocks

|  | Single Component | Multi-Component |
|---|---|---|
| Single Phase | Si, Cu, Ge, water | Si + Ge, Ga + As, silicic acid + water, PVA + water |
| Multi-Phase | slush | alumina + PVA + water |

The feedstock can include any material capable of undergoing temperature-driven solid-to-liquid (melting) and liquid-to-solid (re-solidifying) phase transformations. In addition to metallic and semiconducting materials, which can be made molten, the feedstock can include water, alcohols, naphthalene, etc.

The liquid feedstock is incorporated into the channels of a honeycomb substrate. As used herein, a honeycomb substrate refers to a solid structure comprising a plurality of substantially parallel or radially-extending channels that are defined by interconnected and interrelated partitions. The body of channels is defined by a peripheral wall or skin and each of the channels, except possibly those adjacent to the peripheral wall, have essentially the same geometry (shape and dimensions). The cross-sectional shape of the channels can be circular, triangular, square, rhombohedral, hexagonal, etc., as well as combinations thereof. Exemplary cross-sectional channel dimensions (e.g., height and width or diameter) can range from about 500 µm to 1 cm. Channel lengths, which can correspond to the overall length of the honeycomb substrate, can vary from 1 cm to 1 m. The interconnected and interrelated partitions, which define the channel walls, can have a web thickness ranging from about 0.05 mm to 2.5 mm. The partitions may be porous or non-porous.

The honeycomb substrate can be formed from a variety of different materials, including metals, semiconductors, ceramics and/or polymers. For example, the honeycomb substrate can comprise Teflon® or a Pyrex® glass. According to one embodiment, the honeycomb substrate comprises a Celcor® cordierite honeycomb monolith, which is marketed by Corning, Inc. Celcor® honeycomb substrates can have a channel density ranging from about 200 to 900 channels/in$^2$ with a corresponding wall thickness ranging from about 2 to 6 mils. The open frontal area of a Celcor® honeycomb substrate is about 50 to 95%. Individual channels within the Celcor® honeycomb can comprise hydrophobic porous surfaces that facilitate deep-bed freeze drying of the liquid feedstock. Additional aspects of suitable honeycomb substrates are disclosed in commonly-owned U.S. Pat. Nos. 5,114,643, 4,417,908 and 4,323,614, the contents of which are hereby incorporated by reference in their entirety.

The liquid feedstock can be incorporated into the channels via capillary forces, gravity or by utilization of a pressure gradient. The liquid feedstock can be backfilled into the channels by wetting, vacuum draw and/or intrusion.

During the initial solidification, the liquid feedstock is advantageously maintained homogeneously incorporated throughout the channels of the honeycomb substrate. Various approaches can be used to contain the liquid feedstock within the channels. In one approach, the liquid feedstock is loaded into a suitable crucible, the honeycomb substrate is submerged into the liquid feedstock in order to incorporate the liquid feedstock into the channels, and the entire system is cooled in order to solidify the liquid feedstock within the substrate. In an alternate approach, after incorporating liquid feedstock into the channels, one axial end face of the honeycomb can be capped to retain the liquid feedstock therein.

Care should be taken to prevent leaks and to minimize settling of multi-component liquid feedstocks. In order to avoid air bubble dissolution, the liquid feedstock can be de-aired before or after incorporating the feedstock into the honeycomb substrate.

After initial solidification of the liquid feedstock within the honeycomb substrate, localized melting and directional re-solidification can be carried out using a variety of apparatus designs. According to embodiments, localized melting and re-solidification is carried by translating a zone heater (e.g., ring heater) relative to the honeycomb substrate. The zone heater produces a localized heated zone within the substrate.

The temperature of the heated zone is greater than the melting point of the solidified feedstock, while the temperatures of the adjacent non-heated zones are less than the freezing point of the liquid phase. Thus, within the localized heated zone, the solidified feedstock is melted. For example, the temperature of the heated zone can range from about −20° C. to 500° C., and the temperature of the non-heated zones can range from about −200° C. to 100° C.

Localized melting and directional re-solidification can thus be achieved by moving the solidified feedstock-containing honeycomb substrate relative to the localized heated zone. It is to be understood that moving the honeycomb substrate through the heated zone can involve changing the relative positions of the honeycomb substrate and the zone heater. Thus, the "moving" as used herein can include moving the honeycomb substrate, moving the zone heater (e.g., ring heater) or both. As the heated zone moves relative to the honeycomb substrate, an upstream portion of the heated zone induces a melting interface (solid-liquid interface), while a downstream portion of the heated zone induces a re-solidification interface (liquid-solid interface).

As the solidified feedstock passes into the heated zone where the temperature is greater than the melting point of one or more phases in the solid, the solid feedstock is locally melted. As the relative motion between the zone heater and the honeycomb progresses, the locally melted zone will leave the heated zone and directionally re-solidify, which can result in the formation of continuous crystals. In an embodiment, the process is controlled so that a velocity of the melt front (solid-liquid interface) and a velocity of the re-solidification front (liquid-solid interface) are equal so that the relative melting and re-solidification rates are equal to each other and, in turn, equal to the net rate of translation of the zone heater relative to the honeycomb.

The morphology of the liquid-solid interface can be controlled by the choice of feedstock composition, as well as by the temperature gradient and the crystal growth rate. The temperature gradient is controlled by the heated zone temperature, while the velocity of the solid-liquid and liquid-solid interfaces and hence the melt and re-solidification rates are controlled by the translation rate of the zone heater. For instance, at a constant temperature gradient, the spacing between cells or dendrites typically decreases with increasing growth rate. Advantageously, use of a movable ring heater affords independent control of both the thermal gradient and the resulting crystal growth rate.

In embodiments, the honeycomb substrate is advantageously oriented such that its axial channel dimension is aligned substantially parallel to the direction of crystal growth. As the honeycomb substrate is moved through the temperature gradient (or vice versa), the relative rate of translation can be constant or variable. The motion can optionally accompany agitation (e.g., dither).

The localized melting/re-solidification can be accomplished in a single pass of the zone heater, or via multiple passes, which can each involve full or partial re-melting and/or re-solidifying. A multi-pass process can be used to refine the microstructure of the casting.

By localized melting is meant that less than the whole of the solidified feedstock is liquid at any time during the melting/re-solidification process. In embodiments, only that portion of the solidified feedstock proximate to the zone heater is raised to a temperature sufficient to cause melting. By moving the zone heater, a melted region can be translated throughout the substrate.

Due to partitioning by the honeycomb substrate, the melted region comprises a plurality of individual molten pools. A portion of a honeycomb substrate 200 comprising a plurality of channels 202 is shown in cross-sectional in FIG. 1A. A ring heater 250 is positioned circumferentially about an axial dimension of the substrate. A melted region 220 comprising molten pools 222 can be seen located proximate to the ring heater 250.

The ring heater 250 is configured to be translated in an axial direction as indicated by arrow A. As the ring heater 250 moves relative to the substrate 200, so moves the melted region 220 as shown in the temporal sequence of FIGS. 1B through 1D. As the ring heater is swept across the substrate, the previously solidified feedstock 205, which is positioned upstream of the direction of motion of the heater 250 is locally melted in a region proximate to the heater and then re-solidified in a region downstream of the heater to form a directionally solidified region 210. Within each channel, a molten pool 222 is bounded radially by the walls 203 of the channel. Each pool is bounded in an upstream direction by a melt interface 213, which represents the solid-to-liquid phase transformation between the previously solidified feedstock and the molten region 220. Each pool is bounded in a downstream direction by a solidification interface 215, which represents the liquid-to-solid phase transformation between the molten region 220 and the directionally re-solidified region 210.

According to an embodiment, an axial length of the liquid pools (i.e., along the length of the channels) is less than 50% of a total length of the honeycomb substrate (e.g., less than 50, 45, 40, 35, 30, 25, 20, 15, 10, 5, 2 or 1%). For example, a distance between the melt interface and the re-solidification interface can range from about 10 mm to 10 cm, e.g., 5 cm.

The morphology of the directionally solidified crystals is a strong function of the local thermal conditions. For instance, if the locally-melted feedstock ahead of the liquid-solid interface is sufficiently undercooled, the re-solidification interface can acquire a complex, non-planar morphology comprising cells or dendrites. The greater the undercooling, the more complex can be the morphology. For large undercooling and high solidification rates, for example, the crystalline morphology usually comprises long dendrites having side branches. Columnar growth, which is advantageous for forming anisotropic, linear porosity, can be achieved at relatively low growth rates.

It is to be appreciated that a plurality of grains can nucleate and grow within each channel of the honeycomb substrate. According to an embodiment, one or more seed crystals can be incorporated into each channel prior to solidifying the liquid feedstock. The seed crystals can be used to promote a desired crystal orientation during re-solidification, which can promote oriented, single crystal growth and enhance the directionality of the resulting cast structure.

A method of forming a porous casting comprises incorporating a multi-component liquid feedstock into the channels of a honeycomb substrate. A multi-component feedstock can be a multi-phase mixture such as a slurry that comprises particles dispersed in a suitable single- or multi-component liquid or a single-phase solution. Slurries can consist essentially of a solid particle-liquid mixture such as alumina particles dispersed in water, or can further include additional solvents or solutes, such as alumina particles dispersed in a water-PVA solution.

An exemplary method includes incorporating a multi-component liquid feedstock into the channels of a honeycomb substrate to form a feedstock-laden substrate, the multi-component liquid feedstock including a liquid (e.g., solvent) and at least one solute or dispersion of solid particles, solidifying the liquid within the channels, locally melting the solidified feedstock and directionally re-solidifying the melt, and removing the re-solidified liquid from within the channels to form a casting comprising an ordered, porous body of precipitated solute and/or particles within the channels. The relic pores within the porous body can be aligned substantially parallel to the crystal growth direction and can have an aspect ratio greater than 1 (e.g., greater than 1, 2, 4 or 10), where the aspect ratio represents a ratio of length to cross-sectional dimension (height, width or diameter). During or after the process of removing the re-solidified liquid from within the channels to form the porous casting, the casting can be optionally densified. The act of densification, if used, can result in partial sintering such that microporosity is removed from the cast structure, but the macroporosity formed by the re-solidified liquid is retained.

The particles can include metallic, ceramic, or polymeric particles such as, for example, carbon, silicon, germanium, tin, copper, alumina, silica, zirconia, Teflon®, polyethylene, etc., as well as mixtures and alloys thereof. A dispersion can comprise from 0.1 to 90 vol. % particles dispersed in the liquid. The liquid feedstock may include solid particles or particle precursors that, for example, cross-link, gel or precipitate to form particles.

In a further embodiment, a multi-component feedstock can be a single-phase liquid that comprises solute dispersed in a suitable solvent. Example solute materials include silicic acid, polyvinyl alcohol (PVA), etc. Example solvents include water, alcohols, etc. The feedstock can comprise from about 0.01 to 90 vol. % solute dispersed in the solvent.

In lieu of the multi-component liquid feedstocks described above, the liquid feedstock can comprise a single-component, which can be solidified, locally-melted and directionally re-solidified to produce a substantially non-porous casting. Example single-component feedstocks include silicon, germanium, tin, copper, etc.

With each of the foregoing exemplary feedstocks, suitable components (particles, solvent, solute, etc.) can be chosen by a skilled artisan depending, for example, on the desired porosity or other properties of the casting. The particles, if used, can have an average particle size ranging from a few nanometers to about 10 μm. In an embodiment, solid particles incorporated into the liquid feedstock can have an average particle size up to about 10% of the effective dimension (height, width, diameter) of the channel into which the liquid feedstock is incorporated.

A multi-component liquid feedstock such as a dispersion may optionally include one or more solvents or other feedstock modifiers such as surfactants, dispersants, binders, pore formers, etc. that can used, for example, to control nucleation, crystal growth, crystal habit, agglomeration, flocculation and/or precipitation. Dispersants such as DARVAN® brand dispersants, which are aqueous solutions comprising sodium and ammonium polymethacrylate, can be used to prevent agglomeration of the particles in the slurry. Binders such as polyvinyl alcohol (PVA) can be used to enhance green body strength of the templated particles prior to sintering. Pore formers such as starch can be used to enhance the pore size, pore volume and/or connectivity in the resulting casting.

During directional re-solidification, in the example of a liquid feedstock containing particles or a solute, the particles/solute initially suspended in the feedstock are continuously rejected from the solidifying phase. As the crystals grow, liquid is partitioned between the solid and liquid phases. The particles or solute will accumulate in front of the advancing liquid-solid interface and be swept in between adjacent crystals (i.e., along the grain boundaries). Thus, in the case of deep cellular or dendritic interface morphologies, the particles/solute are trapped in the inter-cellular or inter-dendritic spaces. The loss of liquid to the re-solidified phase effectively increases the concentration of particles or solute in the liquid phase, resulting in an increase in the concentration along the crystal growth direction.

Figure 2:
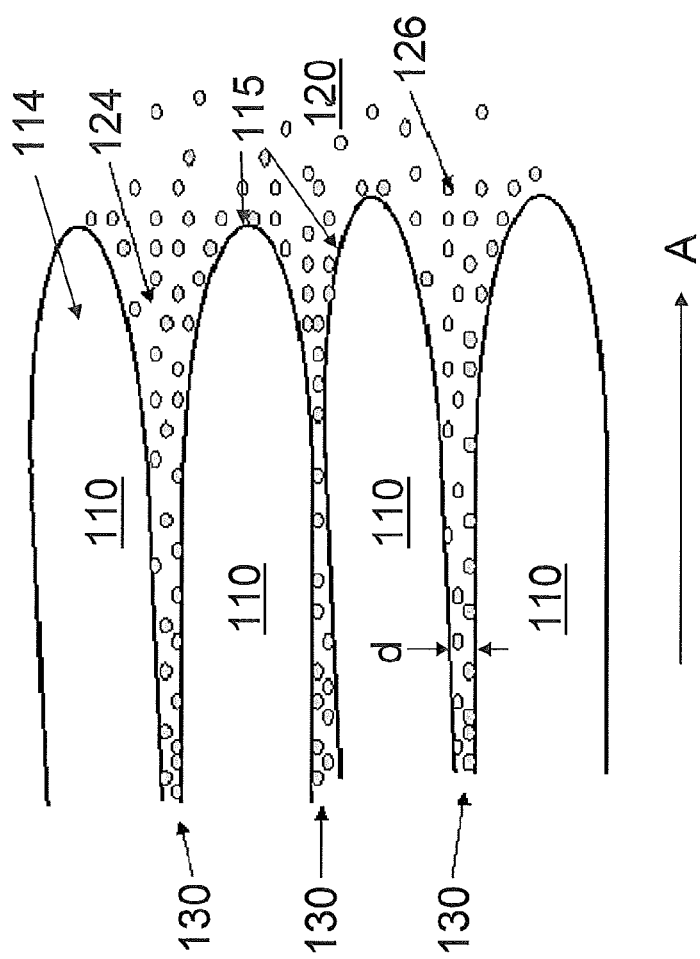
FIG. 2 is a schematic drawing depicting aspects of directional solidification.

These basic attributes of directional solidification involving a multi-phase, multi-component liquid feedstock are shown schematically in FIG. 2. As illustrated in cross-section, a plurality of crystal grains (e.g., ice crystals) 110 are growing from a particle-laden liquid feedstock 120 in a crystal growth direction indicated by arrow A. As the crystal grains grow, liquid phase 124 in transformed into solidified phase 114 at liquid-solid interfaces 115. The liquid feedstock 120 comprises both a liquid phase 124 (e.g., water) having a solid phase (e.g., ceramic particles) 126 dispersed therein. As the liquid phase solidifies, the particles 126 are constantly rejected from the growing crystal grains 110 and accumulate within the inter-cellular or inter-dendritic spaces 130 defining an inter-granular spacing d. The inter-granular spacing may be constant or variable along the crystal growth direction.

To form porous castings, the solidified (e.g., ice) crystals are removed to create the pore structure. The solidified crystals can be removed, for example, by freeze drying whereby the solidified material is transformed directly to the gas phase by sublimation, thus avoiding potential damage caused by surface tension. During sublimation, the pressure is lowered, and enough heat is supplied for the solidified phase to sublimate away. As the gas leaves the system, it leaves behind relic pores in the shape of the previously solidified crystals, i.e., the pores are a replica of the cellular, columnar, lamellar and/or dendritic structure once occupied by the re-solidified phase.

As the sublimation process concludes, a porous body is formed having desirable pore morphology. The porous casting can comprise a two-dimensional array of linear pores or a three-dimensional array of pores. The pores can have a variety of cross-sectional shapes including, for example, circular, oval, or rectangular.

In embodiments where a binder or other modifier is incorporated into the initial liquid feedstock, an optional de-binding step followed by sintering of the cast structure at an elevated temperature can densify the porous body within the channels of the honeycomb substrate. While micro-porosity may or may not be removed by sintering, the macro-porosity created by the crystals is advantageously retained.

In the example of a feedstock comprising a multi-component, single-phase solution, such as a solution of silicic acid in water, the silicic acid can gel prior to or during solidification to form a silicon oxyhydroxide that can phase separate and polymerize to form silica flakes and/or fibers.

The honeycomb substrate itself can be separated from the casting (e.g., by etching, evaporating, leaching, subliming, pyrolyzing, etc.) either before, during or after sintering to produce an array of free-standing castings. Optionally, the array can be melded together in a further processing step to form a monolithic body. Thus, in one embodiment, the casting is a composite material comprising a honeycomb substrate having a porous or non-porous cast material incorporated into the honeycomb channels. In a further embodiment, the casting consists essentially of the cast structure that was formed by directional solidification within channels of a honeycomb substrate, which was subsequently removed.

With the foregoing methods of making a templated casting, independent crystals are grown in each channel of the honeycomb substrate. This localization of the solidification in each channel leads to a number of buffering and baffling advantages that facilitate scale-up of the process, particularly with respect to the formation of porous castings.

The honeycomb-templated localized melting, directional re-solidification process advantageously ameliorates the propensity during directional solidification for randomly-oriented crystals to nucleate and grow unabated. Although the direction of the maximum temperature gradient will eventually promote oriented, parallel grain growth of cellular or dendritic grains, actual processing conditions will likely produce a finite number of mis-orientated (non-parallel) grains that grow and impinge upon one another. This grain impingement can result in an undesired reduction in the available contiguous porosity, a decrease in permeability, and an increase in the tortuosity of the porous casting.

In conventional directional solidification, inefficiencies associated with the nucleation and growth of non-parallel grains are exacerbated by larger diameter ampoules and therefore pose challenges to scale-up. The present configuration provides a natural path to parallelization and scale-up. With the present configuration, crystal grains are confined within individual honeycomb channels such that non-parallel grains in neighboring channels cannot interact with each other. This ultimately results in enhanced directionality and reduced tortuosity.

The confinement of grains within individual honeycomb channels prohibits wide-scale impingement of non-parallel grains, which ultimately results in enhanced directionality and reduced tortuosity. Because the honeycomb substrate effectively decouples the overall casting dimension from the characteristic dimensions that affect thermal and chemical convection, difficulties with thermal and chemical convection induced non-homogeneity along the growth interface and the loss of directionality due to impingement of non-parallel grains can be largely overcome.

An additional advantage of the present approach relates to diminishing the effect of thermal gradients during melting and re-solidification. As noted above, radial thermal gradients and vertically-unstable density stratifications can lead to buoyancy-driven thermal convection that can interfere with desired microstructure formation. The convection-driven flow adjacent to the liquid-solid (re-solidifying) interface can lead to significant particle and/or solute segregation that, in turn, leads to non-homogeneity of the microstructure. Ideally, diffusion during directional re-solidification is limited to only diffusional transport ahead of the liquid-solid interface.

Thermal convection scales with the cubic power of the effective spatial dimension of the liquid body being solidified. Without wishing to be bound by theory, in conventional directional solidification systems, the impact of thermal convection is proportional to $(d_{amp})^3$, where $d_{amp}$ is the effective dimension (e.g., diameter) of the liquid ampoule as measured in the plane of the solidification front (i.e., in the plane normal to the crystal growth direction). Thus, thermal convection and its attendant disadvantages can become increasingly difficult to manage as the ampoule diameter increases. In most directional solidification systems, radial thermal gradients directly threaten successful scale-up The detrimental effects of thermal convection and radial thermal gradients, particularly in the context of scale-up, can be largely overcome by localizing the melting and re-solidification within individual channels of a honeycomb substrate. In various embodiments, the honeycomb substrate establishes an internal boundary condition temperature gradient across the liquid-containing channels. In other words, where $d_{chan}$ is the effective dimension (e.g., diameter or width) of each channel, and $d_{honey}$ is the effective overall dimension of the honeycomb substrate ($d_{chan} \ll d_{honey}$), thermal and chemical convection will be proportional to $(d_{chan})^3$ and will be independent of $d_{honey}$. Thus, the dimension that impacts convection, $d_{chan}$, is effectively decoupled from the scale-up dimension, $d_{honey}$. Moreover, during heating and cooling of the liquid feedstock, thermal transport can be facilitated by the thermal diffusivity of the honeycomb substrate, which tends to be higher than the thermal diffusivity of the liquid feedstock.

A still further advantage of using honeycomb substrates to control the directional re-solidification is the enhanced green body strength imparted by the honeycomb substrate, particularly in conjunction with large dimension porous castings. Despite the use of organic and inorganic binding agents, which can be used to increase the mechanical robustness of a green body, both the acts of sublimation and sintering can lead to collapse of the body if it lacks suitable strength. Indeed, binding agents alone are believed to be inadequate in view of the large stresses and capillary forces that would be encountered in most scaled-up substrates.

The control over the directionality, tortuosity, surface area, spacing, shape and strength in honeycomb-templated porous castings offers far-reaching potential for applications in different fields. This includes SOFCs, electrodes, catalysis, sensors, filtration/separation devices, photocatalysts, etc., all of which benefit from a process to make materials with a desired porous microstructure. For example, the directionality (anisotropy), and low tortuosity of the pores can result in enhanced mass and momentum transport along the pores, while dense walls provide better mechanical stability and solid state conductive properties (thermal, electronic, optical, etc.) than random or isotropic porosity.

Porous castings manufactured according to the foregoing methods can be used in Stirling engine regenerators and thermoacoustic regenerators. In a thermoacoustic regenerator, for example, high-amplitude sound waves can be used to pump heat from one place to another, or a temperature gradient can be used to induce sound, which can be converted to electricity. Example applications for a thermoacoustic regenerator comprising the porous casting include the liquefaction of natural gas, hybrid vehicles and combination stove/refrigerator/water purifiers. Details of thermoacoustic regenerators are described, for example, in U.S. Pat. Nos. 6,725,670 and 5,901,556, the contents of which are hereby incorporated by reference in their entirety.

EXAMPLES

Embodiments will be further clarified by the following examples.

A ring heater-type directional solidification system is shown schematically in cross-section in FIG. 1. Axes X and Z denote a radial and the axial directions, respectively. A Celcor® honeycomb substrate 200 is immersed into a crucible (not shown) containing a liquid feedstock 120 comprising a mixture of about 40 wt. % colloidal alumina and 2 wt. % poly(vinyl) alcohol in water. The Celcor® honeycomb substrate comprises a square array of channels with each channel measuring about 800×800 µm². The wall thickness separating adjacent channels is about 80 µm. As a result of the immersion, honeycomb channels 202 are filled with the liquid feedstock. The liquid feedstock is then solidified within the channels of the honeycomb substrate. This initial solidification may be directional or non-directional.

The solidified feedstock-laden honeycomb is suspended from a guide wire (not shown) and a heater ring 250 is positioned axially around the honeycomb at one end. When turned on, the heater ring 250 generates a heated zone 255 proximate to the heater ring 250, and non-heated zones 242 and 244 adjacent to the heated zone. The length L of the heated zone is about 5 cm. During the localized melt/re-solidification process, the temperature of the heated zone is between about 20° C. and 25° C., the temperature of the non-heated zones are between about −80° C. and −50° C. The relative translation rate of the honeycomb with respect to the heater ring is about 20 μm/sec.

By taking into account the compositional and geometric properties of the sample, and by selecting the temperature of the heated zone, the temperatures of the adjacent non-heated zones, and the relative translation rate of the zone heater, the solid-liquid and liquid-solid interfaces can be translated along a length of the honeycomb to affect localized melting and re-solidification of the feedstock. The liquid-solid interface 215 separates the re-solidified region 210 from locally melted region 220, while the solid-liquid interface 213 separates locally melted region 220 from previous-solidified feedstock region 205.

After localized melting and directional re-solidification, the honeycomb contents can be freeze dried and sintered to form, for example, channels that each comprise a porous casting of directionally solidified alumina. The alumina micro-lamellae can comprise axial platelets of sintered colloidal alumina separated by platelet-shaped pores. The platelets and pores are aligned in a direction substantially parallel to the channels. The inter-lamellae spacing can be about 30 μm.

As used herein, the singular forms "a," "an" and "the" include plural referents unless the context clearly dictates otherwise. Thus, for example, reference to a "liquid" includes examples having two or more such "liquids" unless the context clearly indicates otherwise.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It is also noted that recitations herein may refer to a component of the present invention being "programmed" or "configured" in a particular way. In this respect, such a component is "programmed" or "configured" to embody a particular property, or function in a particular manner, where such recitations are structural recitations as opposed to recitations of intended use. More specifically, the references herein to the manner in which a component is "programmed" or "configured" denote an existing physical condition of the component and, as such, are to be taken as a definite recitation of the structural characteristics of the component.

It will be apparent to those skilled in the art that various modifications and variations can be made to the disclosed embodiments and examples without departing from the spirit and scope of the invention. Since modifications, combinations, sub-combinations and variations of the disclosed embodiments and/or examples may occur to persons skilled in the art, the invention should be construed to include everything within the scope of the appended claims and their equivalents.

What is claimed is:

1. A method of forming a templated casting comprising:
   incorporating a multi-component liquid feedstock comprising at least one solid phase into channels of a honeycomb substrate to form a feedstock-laden substrate;
   solidifying the liquid feedstock within the channels;
   locally melting a portion of the solidified liquid feedstock to form a plurality of liquid pools;
   directionally solidifying the liquid pools within the channels, wherein the liquid pools are bounded in an upstream direction by a melt interface and in downstream direction by a solidification interface and directionally solidifying the liquid pools comprises moving a zone heater with respect to the honeycomb substrate so as to translate the liquid pools through the substrate; and
   removing the directionally solidified feedstock from the channels to form a porous casting of the at least one solid phase within the channels of the honeycomb substrate.

2. The method according to claim 1, wherein the liquid feedstock is a liquid dispersion of solid metal, ceramic or polymer particles.

3. The method according to claim 1, wherein the liquid feedstock is a dispersion of particles in a liquid solution comprising at least one solvent and at least one solute.

4. The method according to claim 1, wherein the honeycomb substrate is formed from at least one of a metal, ceramic or polymer.

5. The method according to claim 1, wherein the honeycomb substrate comprises a plurality of substantially parallel or radial channels that are defined by interconnected and interrelated porous partitions.

6. The method according to claim 1, wherein the honeycomb substrate comprises a plurality of substantially parallel or radial channels that are defined by interconnected and interrelated non-porous partitions.

7. The method according to claim 1, wherein during the solidifying the channels are orientated substantially parallel to a maximum temperature gradient.

8. The method according to claim 1, wherein the acts of locally melting and directionally solidifying the liquid pools comprise moving the feedstock-laden substrate relative to a zone heater.

9. The method according to claim 8, wherein a relative rate of translation of the feedstock-laden substrate and the zone heater is substantially equal to both a localized melt rate of the solidified feedstock and a growth rate of directionally re-solidifying feedstock.

10. The method according to claim 8, wherein the feedstock-laden substrate is moved at a rate effective to produce substantially columnar crystal growth.

11. The method according to claim 8, wherein one or more of a solute concentration, temperature gradient and solidification rate are controlled at values effective to produce cellular and/or dendritic morphologies.

12. The method according to claim 1, wherein a directionally solidified phase is removed by a technique selected from the group consisting of sublimation, etching, evaporation, leaching, and pyrolysis.

13. The method according to claim 1, wherein one or more seed crystals are incorporated into the channels prior to incorporating the liquid feedstock into the channels.

14. The method according to claim 1, wherein a length of the liquid pools along the channels is less than 10% of a total length of the channels.

15. The method according to claim 1, wherein the act of locally melting comprises moving a zone heater relative to the feedstock-laden substrate so as to sweep the plurality of liquid pools along a length of the channels.

16. The method according to claim 1, further comprising sintering the porous casting.

* * * * *